(12) United States Patent
Gilbert

(10) Patent No.: US 6,445,248 B1
(45) Date of Patent: Sep. 3, 2002

(54) LOW NOISE AMPLIFIER HAVING SEQUENTIALLY INTERPOLATED GAIN STAGES

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/561,060

(22) Filed: Apr. 28, 2000

(51) Int. Cl.[7] .............................. H03F 1/14; H03F 3/45
(52) U.S. Cl. ........................................ 330/51; 330/254
(58) Field of Search ................................ 330/254, 282, 330/284, 51; 327/346, 359

(56) References Cited

U.S. PATENT DOCUMENTS

| | | | |
|---|---|---|---|
| 5,077,541 A | 12/1991 | Gilbert | 330/284 |
| 5,432,478 A | 7/1995 | Gilbert | 330/284 |
| 5,572,166 A | * 11/1996 | Gilbert | 330/254 |
| 5,589,791 A | * 12/1996 | Gilbert | 327/359 |
| 5,684,431 A | 11/1997 | Gilbert et al. | 330/254 |
| 5,973,557 A | * 10/1999 | Miyaji et al. | 330/51 |

* cited by examiner

Primary Examiner—Steven J. Mottola
(74) Attorney, Agent, or Firm—Marger Johnson & McCollom

(57) ABSTRACT

A low noise amplifier in accordance with the present invention provides extended dynamic range by sequentially interpolating an array of commonly connected gain stages. The gain stage at one end of the array has a small input signal range, but very low noise. Moving along the array, the gain stages have progressively wider input signal range, but higher noise. By sequentially enabling and disabling the gain stages with an interpolator, the amplifier can provide very low noise operation, while still accommodating larger signals when necessary. Continuous interpolation techniques are preferably utilized to provide smooth transitions between stages. The outputs from the gain stages are coupled to a loading network which is preferably weighted such that the overall gain remains constant regardless of which gain stage is enabled. A buffer amplifier and shunt feedback network provide active impedance matching. By adding a second buffer amplifier and feedback attenuator network, the amplifier can function as an integrated low noise amplifier and variable gain amplifier in one circuit.

38 Claims, 9 Drawing Sheets

LOW NOISE AMPLIFIER HAVING SEQUENTIALLY INTERPOLATED GAIN STAGES

BACKGROUND OF THE INVENTION

Low noise amplifiers (LNAs) are used in many systems where low-level signals must be sensed and amplified. For example, LNAs are utilized in ultrasound imaging equipment to amplify the reflected signal sensed by an ultrasound sensor, and in radio receivers to amplify the radio frequency (RF) signal received by the antenna.

Some prior art LNAs utilize termination resistors as shown in FIG. 1. The value of the termination resistor $R_T$ is typically made equal to $Z_G$ which represents the output impedance of signal generator 10. We can assume amplifier 14 has an infinite input impedance and is presumed to be noise-free. A problem with the circuit of FIG. 1 is the inherent noise penalty due to the noise of the resistor $R_T$.

FIG. 2 is a schematic diagram of a prior art LNA that uses active matching rather than termination to utilize the full available power of the input signal. That is, both the voltage across the termination impedance and the current into that impedance contribute to the final output signal. In the circuit of FIG. 2, the input impedance $Z_{IN}$ seen looking into the amplifier is made equal to the source impedance $Z_G$ by setting the value or $R_F$ equal to $(1+A)Z_G$ where −A is the gain of the amplifier 14, which is assumed for the moment to be noiseless and to have an infinite input impedance. The noise factor NF of the circuit of FIG. 2 is given by $$NF = \sqrt{\frac{2+A}{1+A}} \quad \text{(Eq. 1)}$$

Thus, NF→0 dB as A→∞, and the circuit of FIG. 2 has lower input-referred noise than the circuit of FIG. 1. Using shunt feedback resistor $R_F$ for active matching makes the input-referred feedback resistance appear as though it is transformed to the input as a termination resistor, but with a much smaller noise penalty than that associated with the termination resistor $R_T$ shown in FIG. 1.

FIG. 3 is a schematic diagram of a practical, one-transistor realization of an LNA utilizing the input matching technique of FIG. 2. The circuit of FIG. 3 includes an NPN bipolar junction transistor (BJT) Q1 configured in common-emitter mode, a current source 16, which generates a current $I_C$, and a feedback resistor $R_F$. With a correct choice of $I_C$, $R_F$ and load impedance $Z_L$, the input impedance $Z_{IN}$ seen looking into the LNA can be made equal to the output impedance $Z_G$ of the signal generator.

However, while the circuit of FIG. 3 has very low noise, it also has a limited dynamic range. The dynamic range is bounded by the noise floor at the low end and by distortion at the high end. If the input signal level is lower then the noise floor, it is overwhelmed by the noise, and the LNA produces no useful output. The noise floor for the circuit of FIG. 3 is defined in terms of noise-spectral density and is typically about $1nV/\sqrt{Hz}$ depending on the device characteristics and bias point. At the other extreme, transistor Q1 only provides a usefully linear output signal for input voltages that have a magnitude on the order of the thermal voltage $V_T$, which is about 26 mV at 300K. Beyond input an level of about $V_T/4$, the response becomes markedly nonlinear, thereby introducing distortion and intermodulation which cannot be removed.

The dynamic range of such LNAs is unacceptable for many applications. For example, in a medical ultrasound imaging system, the signal attenuation from the transmitter to the receiver can be anywhere from 0 to 100 dB depending on the distance between the transceiver head and the object being imaged, and the peak signal magnitude may be of the order of 1V peak-to-peak, much greater than can be tolerated by a conventional LNA.

The input signal range of the circuit of FIG. 3 can be extended by using the well-known technique of emitter degeneration, wherein a resistor is connected in series with the emitter of Q1. However, this also introduces noise, so while the high end of the input signal range is extended, the noise floor is also raised, with the net effect that the dynamic range is not greatly improved. Thus, it is apparent that achieving low noise and wide dynamic range are mutually conflicting goals. Many solutions have been advanced to this fundamental problem, but they all have utilized a fixed circuit topology; that is, one which is independent of the signal magnitude.

DETAILED DESCRIPTION

Figure 4:
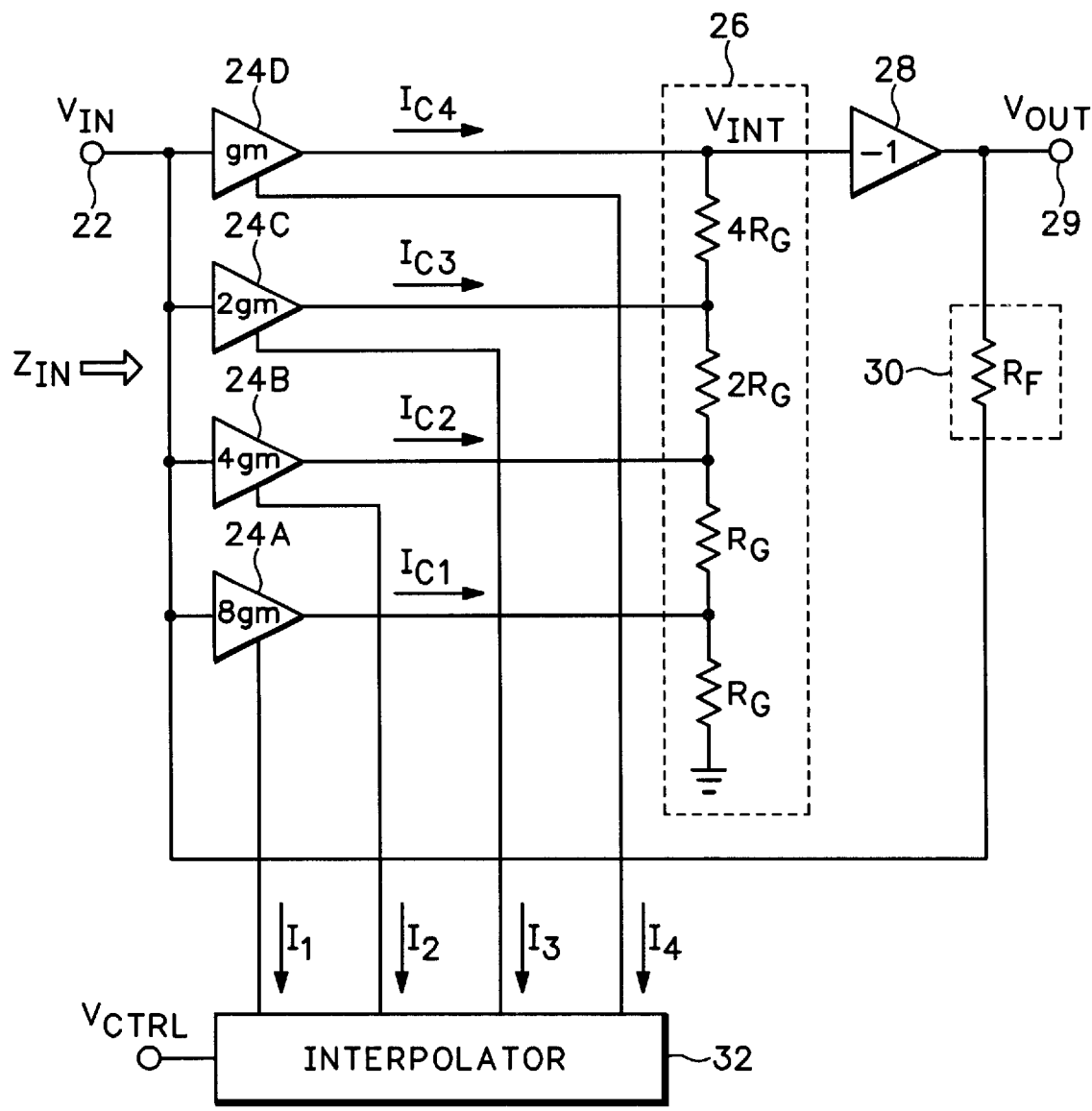
FIG. 4 is a schematic diagram of an embodiment of a low noise amplifier in accordance with the present invention.

An embodiment of a low-noise amplifier in accordance with the present invention is shown in FIG. 4. For purposes of illustration, and to facilitate explanation of the present invention, the embodiment of FIG. 4 is shown with specific components such as transconductance (gm) cells and resistors, with specific component values that are binarily weighted, and with specific signals that are voltages; however, the present invention is not limited to these components, values, and signal types as will be explained in more detail below. Moreover, not every component shown in FIG. 4 is essential for realizing the benefits of the present invention.

Referring again to FIG. 4, the amplifier includes an input terminal 22, a plurality of gain stages 24A–24D, a loading network 26, a buffer amplifier 28, a feedback network 30, and an interpolator 32. By way of example, the gain stages are shown as an array of transconductance (gm) cells having binarily weighted transconductances of gm, 2 gm, 4 gm, and 8 gm. Their inputs are commonly connected to the input terminal 22 to receive the input signal, which, in this example, is a voltage $V_{IN}$. The gm cells are constructed in such a manner that the cell at the lower end of the array (24A) has very low noise, but can only accommodate a small input voltage range. Moving upward along the array, the gm cells have progressively higher noise, but progressively wider input voltage range as well.

The interpolator generates a set of interpolation signals (shown as currents $I_1$–$I_4$) in response to a control signal $V_{CTRL}$. The interpolation signals selectively enable and disable the gm cells. By controlling $V_{CTRL}$, it is possible to enable only the cell or cells which can best accommodate a particular level of input signal. For example, with a very small input signal, only the lowest gm cell 24A is enabled because a wide input signal range is not needed, but the lowest possible noise is essential. At the other extreme, with a very large input signal, only the highest gm cell 24D is enabled because it has the widest input signal range; although it is the noisiest of the gm cells, this is of little consequence with a large input signal. Between the two extremes, the gm cells are interpolated in a sequential (and preferably continuous) manner as described in more detail below.

The control signal $V_{CTRL}$ will often already be available in systems required to accommodate signals of large dynamic range. For example, in a medical ultrasound system, there is a voltage called the "TGC ramp," where "TGC" means "time-gain control" and is used later in the signal chain to vary the overall gain. Alternatively, in a radio receiver, the AGC (Automatic Gain Control) bias is available and can be used as $V_{CTRL}$ to enhance the dynamic range of the overall system.

In some embodiments of the present invention, a substantially constant gain is needed in the LNA, partly because the gain is implicated in setting up the matched input impedance, as described below, and also because the LNA output may be needed at a fixed gain level, for example, in Doppler imaging for medical ultrasound.

The gm cells generate a set of output signals (shown here as currents $I_{C1}$–$I_{C4}$) which are applied to the loading network 26, which in FIG. 4 is shown as a string of binarily weighted resistors $4R_G$, $2R_G$, and $R_G$ with another resistor $R_G$ to ground GND. The output from the loading network is the intermediate signal $V_{INT}$. As the interpolator sequentially enables the gm cells from the bottom to the top in FIG. 4, the enabled gm cell has progressively lower transconductance, but the loading network provides a proportionally higher resistance, with the net result that the overall voltage gain remains constant. That is, the voltage gain A of a transconductance cell driving a resistive load is the product of the transconductance and the load resistance. The load seen by the lowest gm cell 24A is $R_G$. Since this cell has a transconductance of 8 gm, the gain is 8 $gmR_G$. At the other extreme, the load seen by the upper gm cell 24D is $8R_G$. Since this cell has a transconductance of gm, the overall gain A (where $A=V_{INT}/V_{IN}$) is still 8 $gmR_G$ when the upper gm cell is enabled.

The loading network is not limited to a resistor string, and the gain stages are not limited to gm cells. Any suitable technique can be used for loading the gain stages such that each gain stage sees a different load so as to correct for the different amplification provided by the different gain stages. Preferably though, the gain stages and loading network are constructed so that the overall gain of the gain stages combined with the loading network is substantially constant regardless of which gain stage or stages are enabled by the interpolator.

In the example of FIG. 4, the gm cells are binarily weighted for convenience, so the loading network is binarily weighted as well. However, the present invention is not limited to binary weighting, and other weighting factors can be used. The number of gain stages can also be varied depending on the dynamic range provided by each gain stage and the total dynamic range required from the system as a whole. Four stages are shown in FIG. 4 for simplicity and clarity, but the present invention can be generalized to "n" gain stages, in which case, the interpolator and loading network must also be designed to provide the desired number of interpolation signals and load inputs, respectively. The loading network can be realized not only with resistors, but also with inductors, capacitors, etc., or even an active load depending on the application.

Although it is an optional feature, the embodiment of FIG. 4 uses shunt feedback through $R_F$ to provide active matching of the input impedance by making the feedback resistance $R_F$ appear to be transformed to the input as a termination resistor, but without the associated noise degradation. To provide an input impedance $Z_{IN}$ at the input terminal 22, the feedback resistor is set to $R_F=(1+A)Z_{IN}$ where A is the overall gain of the combined gain stages and loading network. In the example of FIG. 4, $A=8$ $gmR_G$. For the shunt feedback to work properly, the buffer amplifier 28 must an inverting type amplifier, although inverting operation can also be achieved by selecting the correct polarity if the gm cells are implemented in differential form. It should be noted that the shunt feedback maintains the input impedance constant even as the different gain stages are enabled and disabled.

For purposes of illustration, the buffer amplifier in FIG. 4 is shown with a gain of −1. In a practical implementation, the buffer amplifier would most likely be an operational amplifier configured for high input impedance with its own feedback loop and typically set to a higher gain. As with the loading network 26, the feedback network 30 is not limited to a simple resistor $R_F$, but can be realized using any suitable network.

Although the active matching provided by the inverting buffer amplifier and feedback network greatly improve the performance of the system, the benefit of extended dynamic range provided by the interpolated gain stages, each of which have different noise and input range, can be realized even in the absence of the buffer amplifier and feedback network.

As discussed above, the gain stages are sequentially interpolated. One way to accomplish this would be by switching one of the gain stages completely on, and the rest completely off. However, this would produce discontinuities when the gain stages switch on and off abruptly as the control voltage $V_{CTRL}$ is swept though the entire control range. To provide a smoother transition between stages, the gain stages are preferably enabled and disabled gradually in a continuous technique in which one of the interpolation signals gradually increases while the adjacent interpolation signal gradually decreases. Thus, as $V_{CTRL}$ changes, a centroid or "point of action" can be envisioned as moving along the array of gain stages to provide continuous interpolation. Some examples of interpolators suitable for use with the system of FIG. 4 are disclosed in U.S. Pat. Nos. 5,684,431; 5,432,478; and 5,077,541, all by the inventor of the present application. Another example is disclosed in U.S. patent application Ser. No. 09/466,050 filed Dec. 17, 1999 entitled "Interpolator Having Dual Transistor Ranks and Ratiometric Control" by the same inventor as the present application and which is incorporated by reference. When continuous interpolation is used, the gm value for each gain stage shown in FIG. 4 is the maximum gm value which is only achieved when the corresponding interpolation signal is at its peak value.

Figure 5:
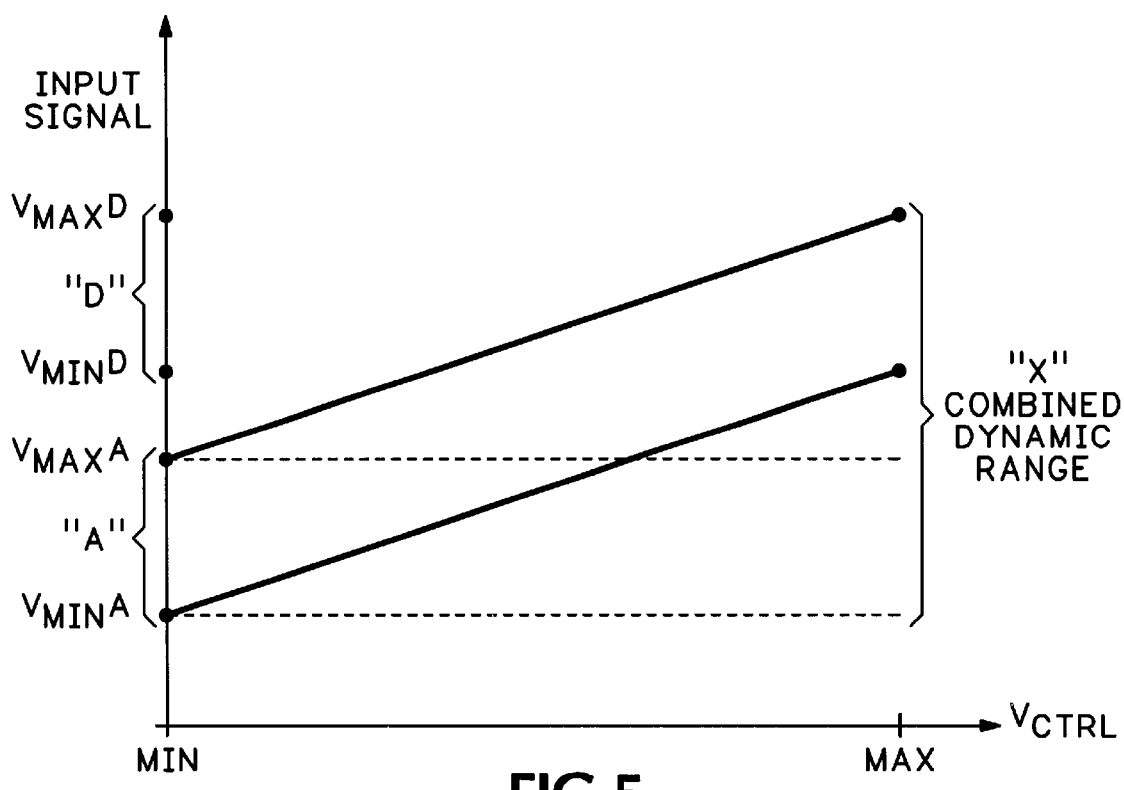
FIG. 5 is a diagram which illustrates dynamic range of the low noise amplifier of FIG. 4.

One of the benefits of adaptively enabled gain stages in accordance with the present invention can be better understood with reference to FIG. 5 which shows the upper and lower limits of the input signal range of the amplifier of FIG. 4 as a function of the control signal $V_{CTRL}$. When the control signal is at its minimum value, only the lowest gm cell 26A is enabled. This cell has a noise floor at $V_{IN}=V_{MIN}A$ and a maximum distortion-free input at $V_{MAX}A$. The dynamic range of gm cell 26A is thus shown by the bracket "A". As the control signal $V_{CTRL}$ increases, the centroid of the interpolation signals moves upward along the array of gm cells in FIG. 4, thereby sequentially enabling the different gm cells and raising both the noise floor and the upper end of the input signal range. When $V_{CTRL}$ reaches its maximum value, only the upper gm cell 26D is enabled, and its dynamic range is shown by bracket "D". However, by varying $V_{CTRL}$, the entire combined dynamic range of all of the gain stages is available, and the overall dynamic range of the system is as shown by the bracket "X". For comparison, the broken lines in FIG. 5 show the limited dynamic range that would be realized if only one gm cell was used.

Although the gain stages can be implemented in many different ways, the use of common emitter (or common source) gm stages makes it easy to interface the gain stages to an interpolator. One way the gain stages can be implemented is with an array of differential pairs of bipolar junction transistors (BJTs) in which the bottom pair has no emitter degeneration so as to minimize noise, but each pair moving up the array has progressively more degeneration so as to provide wider input signal range at the expense of increasing noise. Another possible technique is to use a differential pair of BJTs at the lower end, a multi-tanh doublet for the next gain stage (see, e.g., U.S. patent application Ser. No. 09/212,089 filed Dec. 15, 1998 entitled "Multi-Tanh Doublet Using Emitter Resistors" issued Jul. 11, 2000 as U.S. Pat. No. 6,087,883 by the same inventor as the present application), a multi-tanh triplet for the next stage, and so on.

Figure 6:
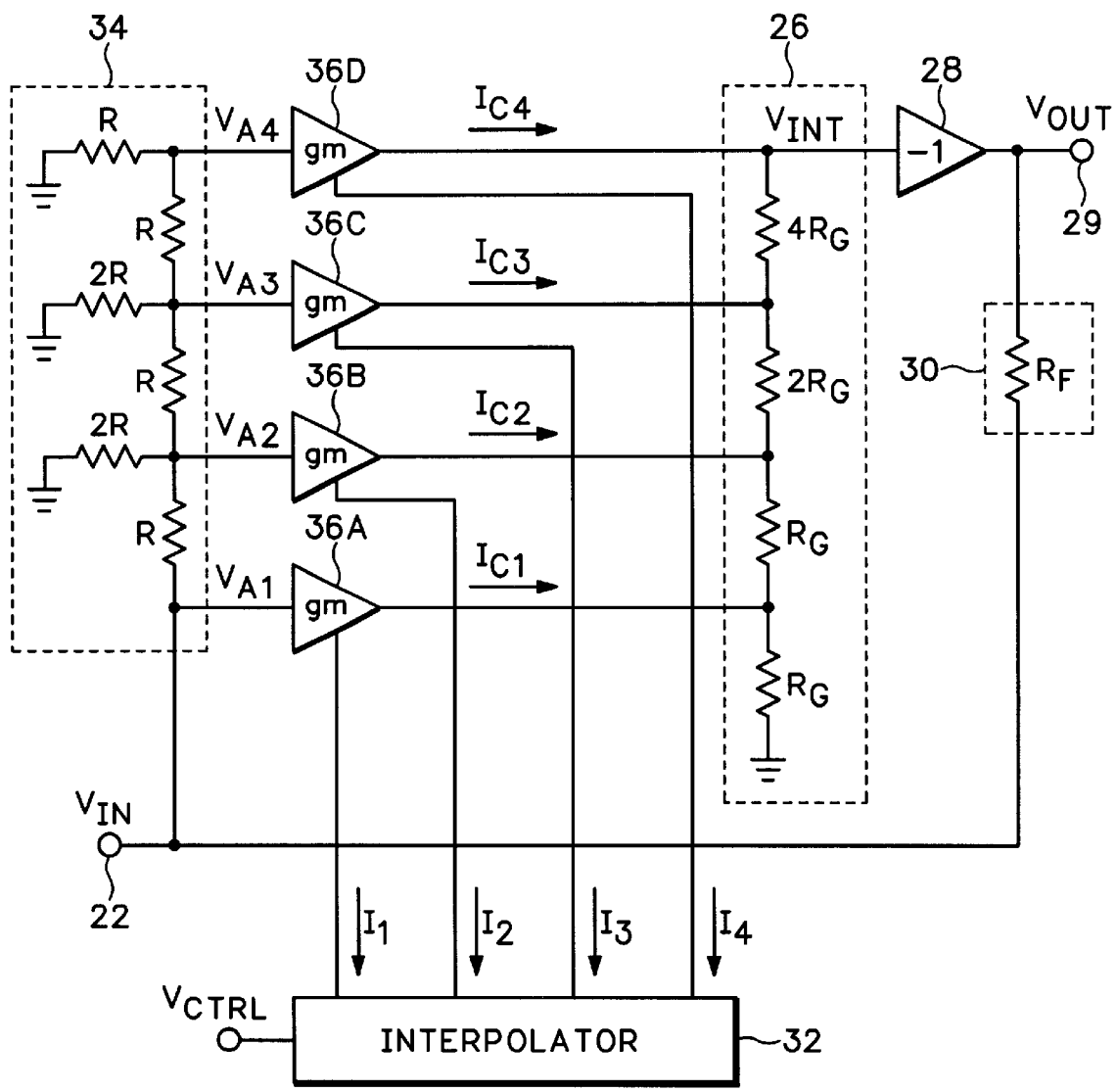
FIG. 6 is a schematic diagram of another embodiment of a low noise amplifier in accordance with the present invention.

In a preferred embodiment, the gain stages are realized using continuously interpolated gm cells that all have the same maximum transconductance, but which receive progressively attenuated versions of the input signal as shown in FIG. 6. An input attenuator 34 receives the input signal $V_{IN}$ and generates a number of progressively attenuated signals $V_{A1}$–$V_{A4}$ which are received by the gm cells 36A–36D. In the embodiment of FIG. 6, the input attenuator is realized with an R2R ladder so that the attenuated signals are binarily weighted. In all other respects, the design and operation of the system of FIG. 6 is the same as that of FIG. 4. Even though the gm cells have the same maximum transconductance, the amplification provided by each gain stage is binarily weighted since the gm cells receive attenuated signals that are binarily weighted.

As with the embodiment of FIG. 4, binary weighting is not essential to the operation of the system of FIG. 6, and any suitable technique can be used for loading the gain stages such that each gain stage sees a different load so as to correct for the different amplification provided by the different gain stages. It should also be noted that the input attenuator 34 shown in FIG. 6 need not be implemented as a resistive ladder. A string of binarily weighted resistors will also provide binarily weighted attenuated signals to the gm stages. If the gm stages are implemented with metal-oxide-semiconductor field effect transistors (MOSFETs), the input attenuator can utilize capacitors instead. Moreover, many other devices such as inductors, as well as active devices, can also be utilized in the attenuator network.

Figure 7:
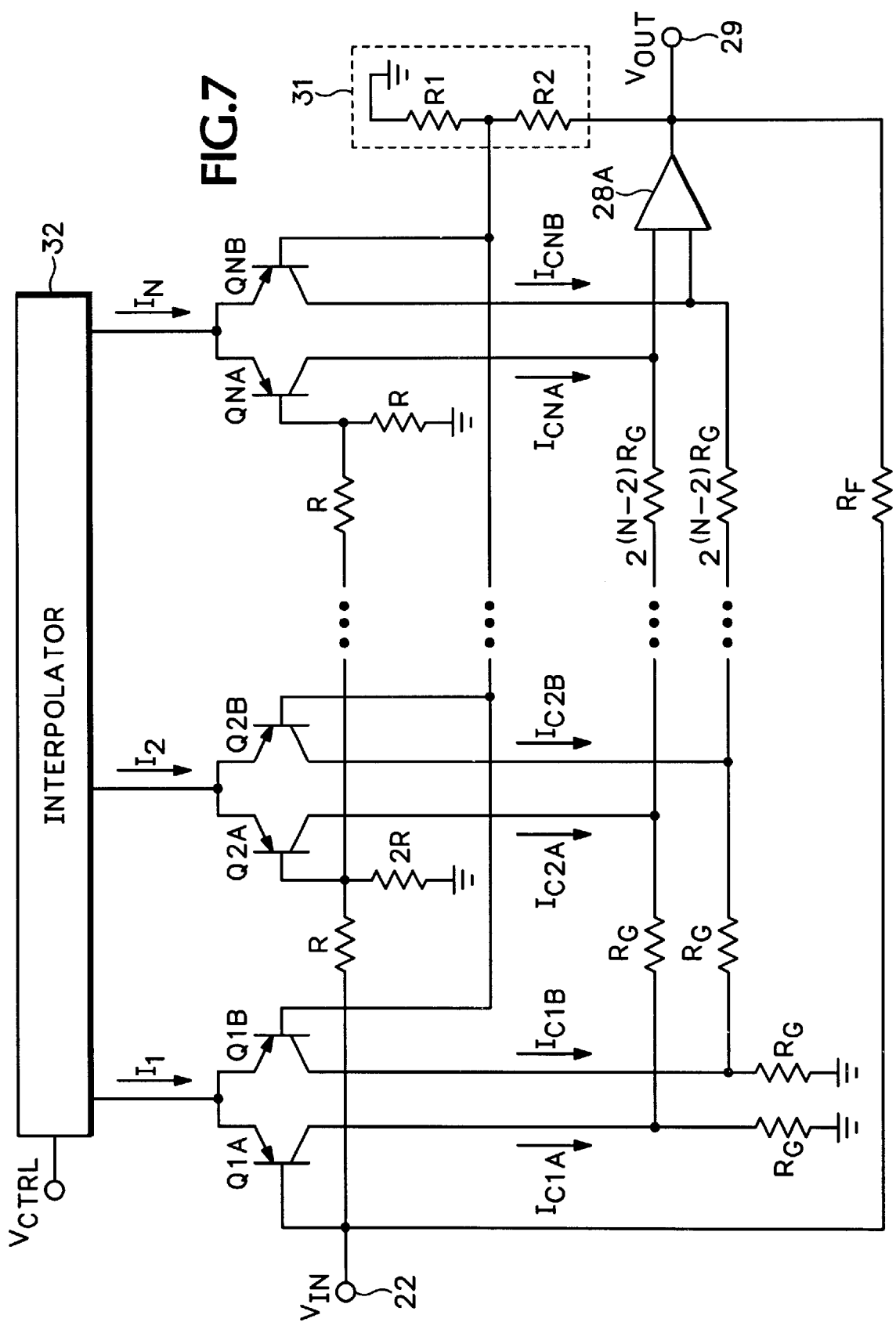
FIG. 7 is a schematic diagram showing more details of one possible practical implementation of the low noise amplifier of FIG. 6.

FIG. 7 is a schematic diagram showing more details of one possible practical implementation of the low noise amplifier of FIG. 6. The system of FIG. 7 utilizes identical PNP differential pairs as the gm cells. One input to each of the differential pairs is connected to a corresponding one of the tap points of an R2R ladder which is connected to the input terminal 22. The second input to each of the differential pairs is connected to a common node which is driven by the buffer amplifier 28A, which, in this embodiment, is a differential input amplifier having its own internal feedback. The output currents $I_{C1A}/I_{C1B}$, $I_{C2A}/I_{C2B}$, ... $I_{CnA}/I_{CnB}$ from the gm cells are coupled to two binarily weighted resistor strings which form a filly differential loading network. Each of the strings is anchored to GND at one end and drives one input of the buffer amplifier 28A at the other end. Each of the gm cells is biased by one of the interpolation currents $I_1$, $I_2$, ... $I_n$ from the interpolator. In this example, the maximum value of each of the interpolation currents is equal. The feedback network is a single resistor $R_F$ connected between the output of the buffer amplifier and the input terminal 22. The overall gain can be adjusted by the feedback network 31, which in this example, is shown as a resistive divider formed from resistors R1 and R2.

The system of FIG. 7 is but one example of the manner in which the low noise amplifier of FIG. 6 can be implemented, and it should be understood that many other variations are possible. For example, the outputs from the gm cells need not be fully differential—it would be possible to utilize only one output from each gm cell, in which case, the loading network would only need one string of resistors, and the buffer amplifier 28A could have a single-ended input. As further examples, NPN rather than PNP transistors could be used, as could MOS transistors or any other type of current control device. An R2R network like that used for the input attenuator could be used for the loading network, and conversely, the binary weighted resistor string like that used for the loading network could be used for the input attenuator. Again, binary weighting is convenient, but not essential.

Figure 1:
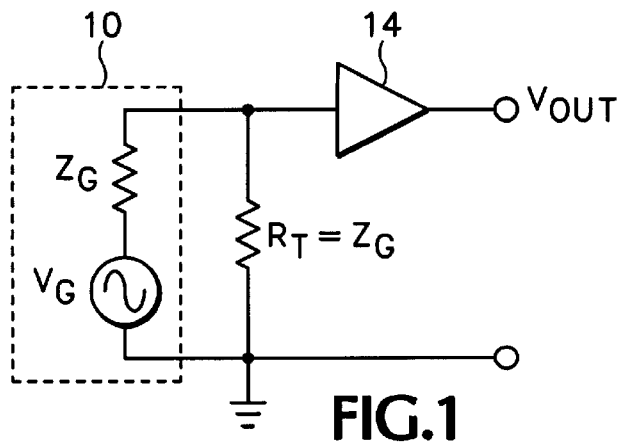
FIG. 1 is a schematic diagram of a prior art low noise amplifier.
Figure 2:
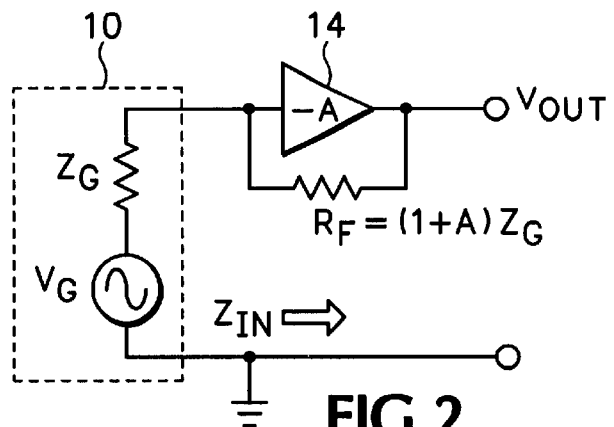
FIG. 2 is a schematic diagram of another prior art low noise amplifier.
Figure 3:
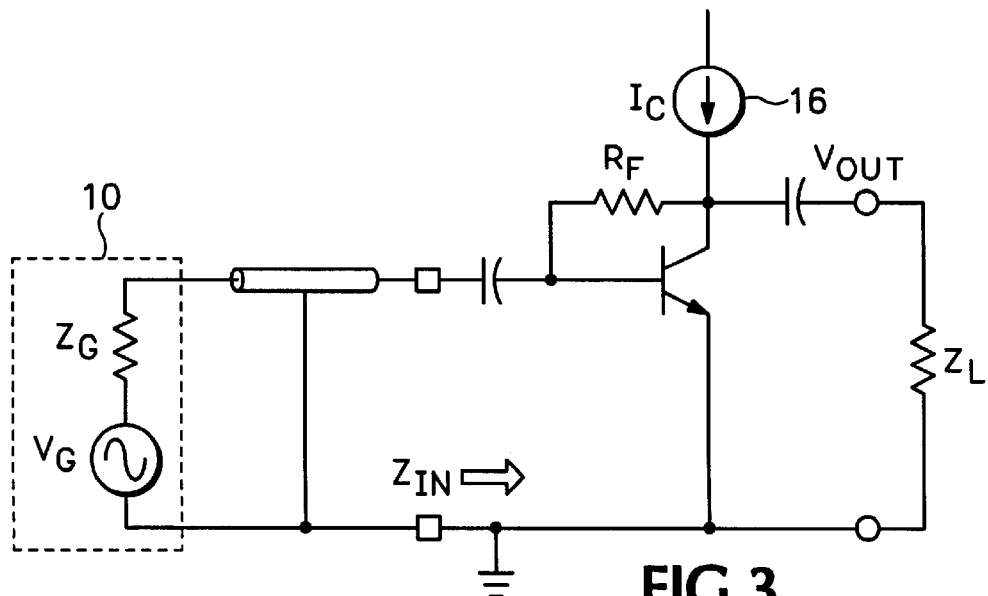
FIG. 3 is a schematic diagram of a practical prior art RF LNA.

A benefit of the circuit of FIG. 7 is that it can utilize identically sized transistors for each gm cell while still providing different amplification, input signal range and noise levels for each gain stage. It provides an LNA having constant gain and input impedance, but can still handle large input signals. Although the input attenuator does dissipate some of the input signal power, the active matching provided by the shunt feedback resistor $R_F$ allows for the use of much larger valued resistors in the input attenuator than would be needed for a direct termination configuration of the kind shown in FIG. 1. Thus, the noise figure is reduced substantially.

Further enhancements will now be described with reference to FIG. 4. If the buffer amplifier 28 is realized as a selectable gain amplifier which can be controlled, for example, by digital signals from a microprocessor, then the circuit will provide selectable input impedance. This would be useful for accommodating different transducer heads on a medical ultrasound imager where each head has a detector with a different characteristic impedance. Alternatively, the feedback network 30 can be implemented as a variable impedance circuit to provide the same effect.

As discussed above, a ramp signal can be used as the control voltage $V_{CTRL}$ to provide "time control" of the interpolator. This is useful for ultrasound imaging because, the longer it takes the signal to reach the receiver, the more attenuated the signal will be. In other words, the control voltage begins at its maximum value when an ultrasonic pulse is first transmitted. This causes the interpolator to enable the top gain stage in FIG. 4 which can accommodate the largest input signal. The control signal $V_{CTRL}$ is then ramped down, and gain stages closer to the bottom are sequentially enabled in anticipation of receiving a smaller and smaller input signal. Once again, a wide range of input signals can be handled, but with very low noise and with constant impedance matching.

In another embodiment of the present invention, an LNA in accordance with the present invention is used as a front end in a radio receiver having an automatic gain control (AGC) loop. Even though there is no a priori knowledge of the strength of the signal received at the antenna, this information can be obtained from the AGC subsystem, and the AGC gain control signal can be used to drive the interpolator.

Combined LNA and VGA

In many applications, the output signal from a low noise amplifier is fed directly into a variable gain amplifier (VGA) such as those disclosed in U.S. Pat. Nos. 5,684,431 and 5,077,541, both by the inventor of the present application. The present invention also contemplates a scheme for combining an LNA and a VGA into a single circuit. Such a scheme is illustrated in FIG. 8 which is a simplified schematic diagram of a combined LNA and VGA in accordance with the present invention.

Figure 8:
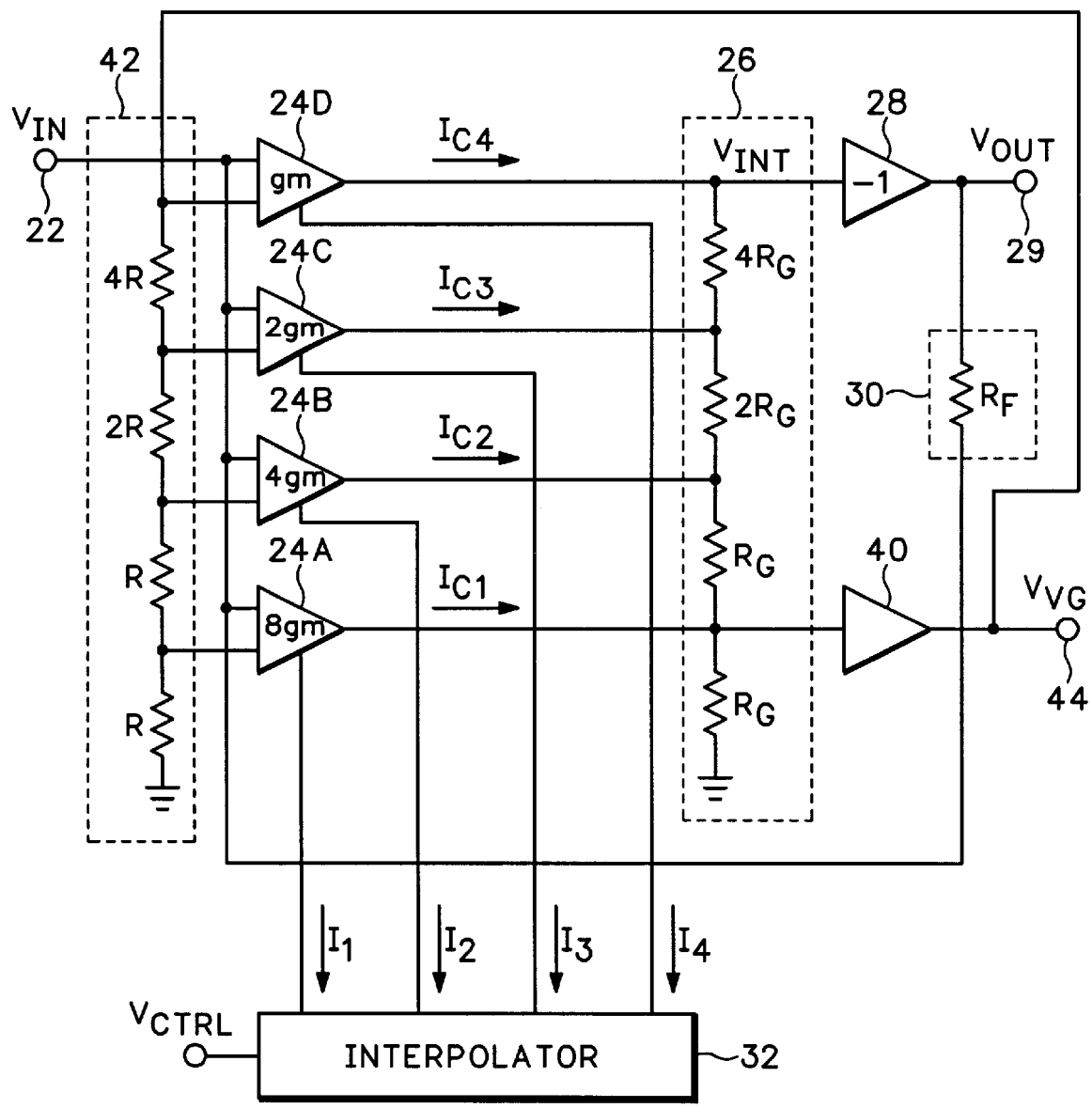
FIG. 8 is a schematic diagram of an embodiment of a combined low noise amplifier and variable gain amplifier in accordance with the present invention.

The circuit of FIG. 8 includes a loading network 26 and buffer amplifier 28 identical to those shown in FIG. 4, and the gain stages 38A–38D are essentially the same as the gain stages 26A–26D in FIG. 4, except that they are shown with differential inputs, wherein one input of each gain stage is connected to the input terminal 22. The circuit of FIG. 8, however, further includes a second buffer amplifier 40, which has an input connected to the opposite end of the loading network as buffer amplifier 28. The output of the second buffer amplifier is connected to a feedback attenuator network 42 which, as an example, includes a string of binarily weighted resistors R, R, 2R, 4R. Each tap point of the resistor string is connected to the other input of one of the gain stages, which in this example, are gm cells having binarily weighted transconductances. Thus, each gain stage moving down the array receives a progressively more attenuated version of the feedback signal $V_{FB1}$–$V_{FB4}$.

The gain stages in the circuit of FIG. 8 are sequentially interpolated in response to the control signal $V_{CTRL}$ in the same manner as the circuit of FIG. 4. The variable gain output signal $V_{VGA}$ is provided at the output of the second buffer amplifier 40 at terminal 44, while the LNA output signal $V_{OUT}$ is still provided at terminal 29. Thus, a VGA and adaptive LNA are integrated into a single amplifier that has very low noise at the input, and it capable of handling a wider range of input signals.

As with the circuits described previously, a combined LNA and VGA in accordance with the present invention is not limited to the specifics shown in FIG. 8. Different numbers of gain stages can be utilized, and binary weighting is convenient, but not essential, etc. The attenuator networks and loading networks can be realized with resistors, including R2R networks and resistors strings, or with capacitors, inductors, active components, etc. The use of gm cells for the gain stages is preferable, but not essential, and the input impedance can be made selectable by using a selectable gain amplifier for the buffer amplifier 28.

Figure 9:
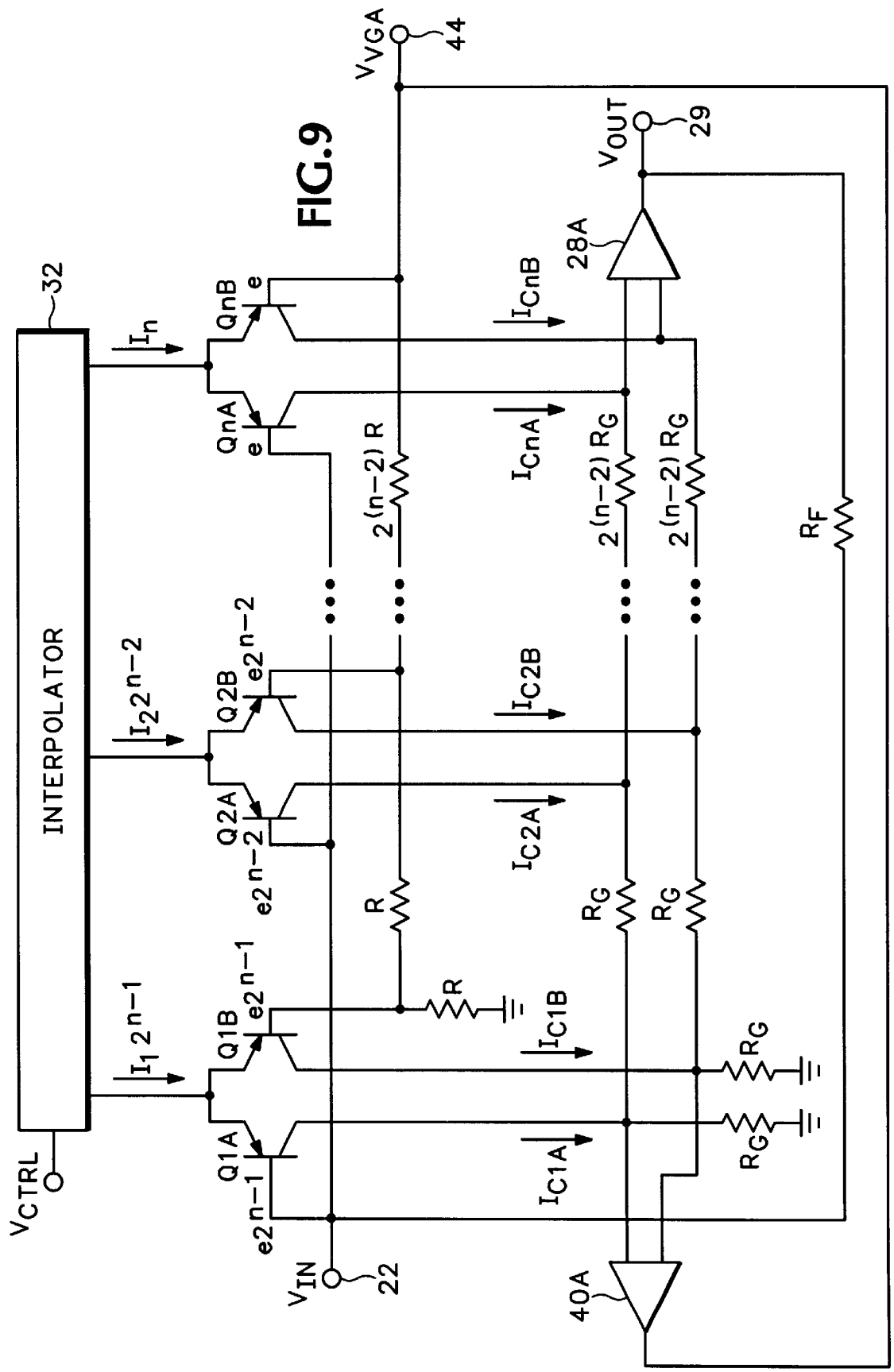
FIG. 9 is a schematic diagram showing more details of one possible practical implementation of the amplifier of FIG. 8.
Figure 10:
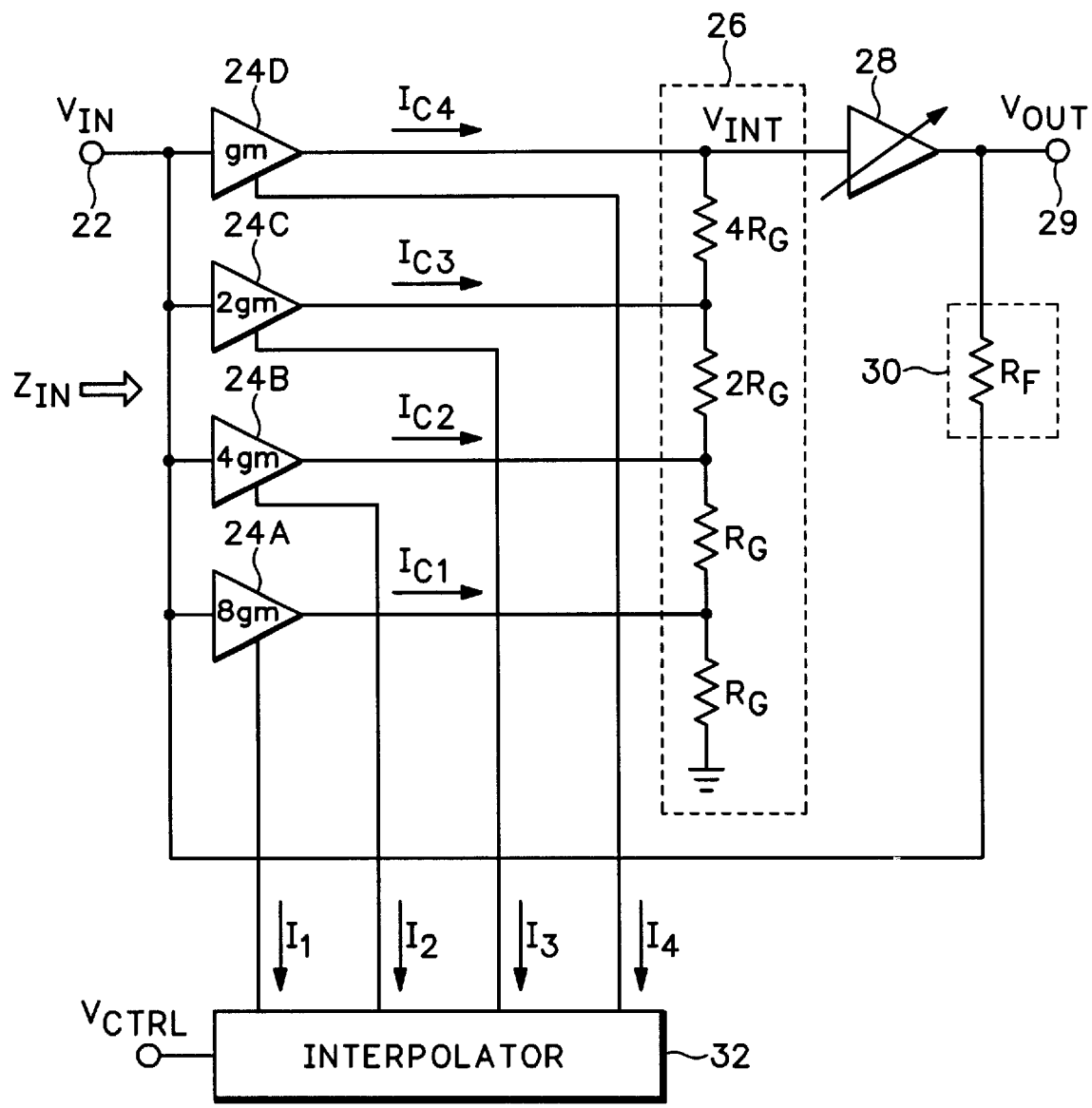
FIG. 10 is a schematic diagram showing an alternative embodiment of an amplifier in accordance with the present invention in which the buffer amplifier of FIG. 8 is replaced with a selectable gain amplifier.
Figure 11:
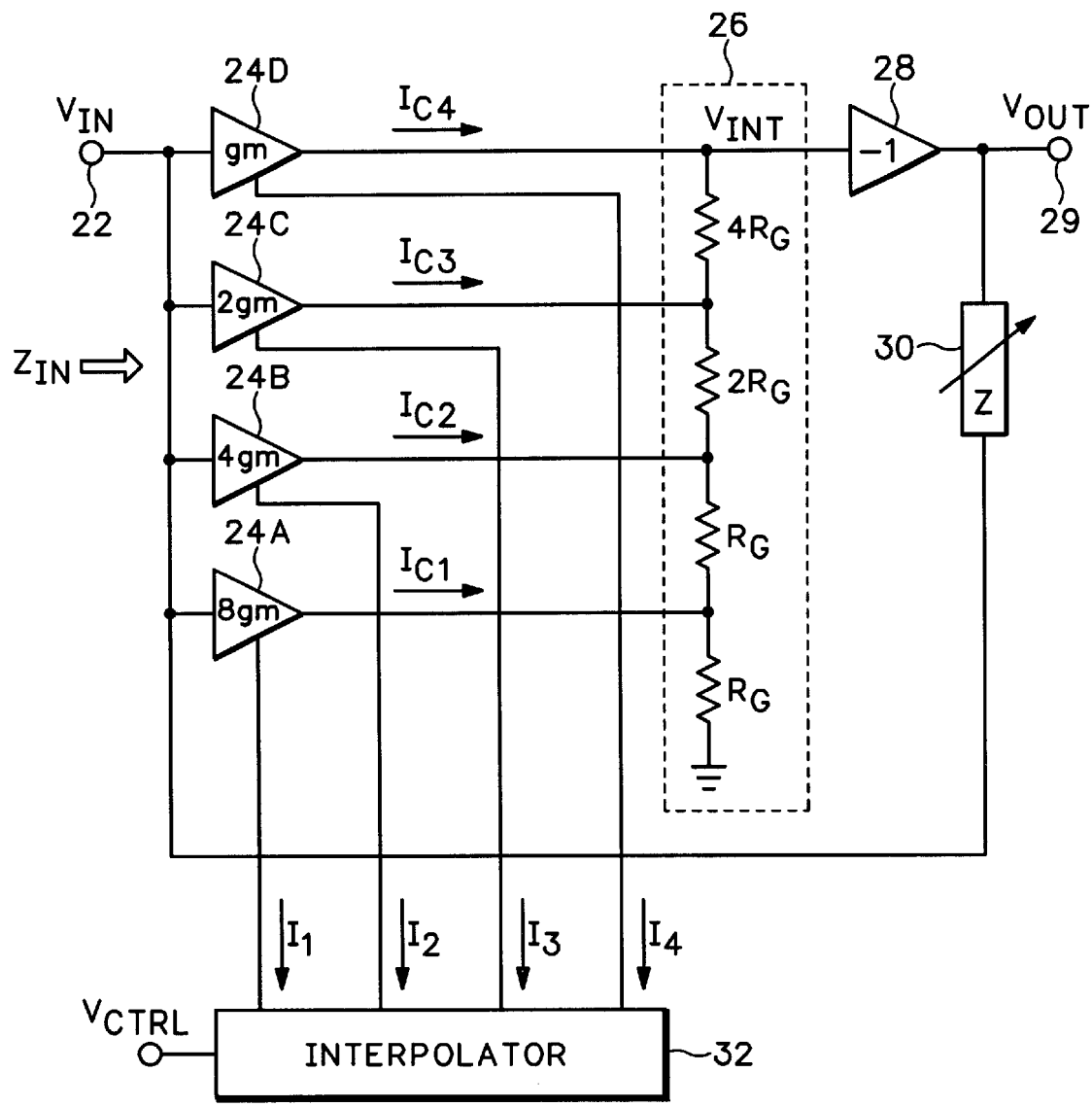
FIG. 11 is a schematic diagram showing an alternative embodiment of an amplifier in accordance with the present invention in which the feedback resistor of FIG. 8 is replaced with a variable impedance circuit.

FIG. 9 is a schematic diagram showing more details of one possible practical implementation of the combined LNA and VGA of FIG. 8. The circuit of FIG. 9 uses binarily weighted resistor strings for both the feedback attenuator network and the loading network, the latter being fully differential. The gain stages are implemented as differential pairs of PNP transistors Q1A/Q1B, Q2A/Q2B, . . . QnA/QnB. To provide a different transconductance for each pair, the interpolation currents $I_1$–$I_n$ are binarily weighted. Therefore, the interpolator must be capable of directly generating weighted currents, or the normal interpolation currents must be weighted using some type of multiplier scheme. As a further refinement, the emitter areas of the differential pairs are also weighted for the purpose of reducing their inherent resistances ($R_B$ in BJT, channel resistance in MOS) and improving matching. That is, transistors QnA and QnB have unit emitter areas "e", and each pair gets progressively larger moving down the array until reaching the other end where the emitter areas of Q1A and Q1B are "$2^{(n-1)}$e".

It should be understood that the circuit of FIG. 8 is not limited to the details shown in FIG. 9. Many details can be changed to accommodate the specific application for which the circuit will be used.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. An amplifier comprising:
   an input terminal for receiving an input signal;
   a plurality of gain stages coupled to the input terminal for generating a plurality of output signals responsive to the input signal, wherein the gain stages have different noise and different input signal ranges;
   a loading network coupled to the plurality of gain stages for loading the output signals, wherein the loading network is constructed to provide different impedances to the gain stages; and
   an interpolator coupled to the plurality of gain stages.

2. An amplifier comprising:
   an input terminal for receiving an input signal;
   a plurality of gain stages coupled to the input terminal for generating a plurality of output signals responsive to the input signal, wherein the gain stages have different noise and different input signal ranges;
   a loading network coupled to the plurality of gain stages for loading the output signals; and
   an interpolator coupled to the plurality of gain stages;
   wherein:
   each gain stage has an output; and
   the loading network comprises a string of resistors, wherein each resistor is coupled between the outputs of two gain stages.

3. An amplifier according to claim 2 wherein the resistors are binarily weighted.

4. An amplifier according to claim 1 further comprising a buffer amplifier having an input and an output, wherein the input of the buffer amplifier is coupled to the loading network.

5. An amplifier according to claim 4 further comprising a feedback network coupled between the output of the buffer amplifier and the plurality of gain stages.

6. An amplifier comprising:
an input terminal for receiving an input signal;
a plurality of gain stages coupled to the input terminal for generating a plurality of output signals responsive to the input signal, wherein the gain stages have different noise and different input signal ranges;
a loading network coupled to the plurality of gain stages for loading the output signals;
an interpolator coupled to the plurality of gain stages; and
a feedback network coupled between the output of the buffer amplifier and the plurality of gain stages;
wherein the buffer amplifier has a selectable gain.

7. An amplifier comprising:
an input terminal for receiving an input signal;
a plurality of gain stages coupled to the input terminal for generating a plurality of output signals responsive to the input signal, wherein the gain stages have different noise and different input signal ranges;
a loading network coupled to the plurality of gain stages for loading the output signals;
an interpolator coupled to the plurality of gain stages; and
a feedback network coupled between the output of the buffer amplifier and the plurality of gain stages;
wherein the feedback network is a variable impedance circuit.

8. An amplifier according to claim 1 wherein the gain stages have different gains.

9. An amplifier according to claim 8 wherein the gain stages are binarily weighted.

10. An amplifier according to claim 1 wherein:
the gain stages have the same gain; and
the gain stages are coupled to the input terminal through an attenuator network.

11. An amplifier according to claim 10 wherein the attenuator network provides binarily weighted attenuation.

12. An amplifier comprising:
an input terminal for receiving an input signal;
a plurality of gain stages coupled to the input terminal for generating a plurality of output signals responsive to the input signal, wherein the gain stages have different noise and different input signal ranges;
a loading network coupled to the plurality of gain stages for loading the output signals; and
an interpolator coupled to the plurality of gain stages;
wherein the gain stages and loading network are constructed such that the overall gain of the gain stages combined with the loading network is substantially constant regardless of which gain stage or stages are enabled.

13. An amplifier comprising:
an input terminal for receiving an input signal;
a plurality of gain stages coupled to the input terminal for generating a plurality of output signals responsive to the input signal, wherein the gain stages have different noise and different input signal ranges;
a loading network coupled to the plurality of gain stages for loading the output signals;
an interpolator coupled to the plurality of gain stages;
a feedback network coupled between the output of the buffer amplifier and the plurality of gain stages; and
a second buffer amplifier having an input and an output, wherein the input of the second buffer amplifier is coupled to the loading network.

14. An amplifier according to claim 13 further comprising a feedback attenuator network coupled between the output of the second buffer amplifier and the plurality of gain stages.

15. A method for amplifying an input signal comprising:
generating a plurality of output signals responsive to the input signal using a plurality of gain stages, wherein the gain stages have different noise and different input signal ranges;
loading the output signals with a loading network that presents different loads to the gain stages, thereby generating a single intermediate signal; and
selectively enabling and disabling the gain stages.

16. A method for amplifying an input signal comprising:
generating a plurality of output signals responsive to the input signal using a plurality of gain stages, wherein the gain stages have different noise and different input signal ranges;
loading the output signals, thereby generating an intermediate signal; and
selectively enabling and disabling the gain stages;
wherein loading the output signals comprises loading the output signals with binarily weighted loads.

17. A method according to claim 15 further comprising buffering the intermediate signal, thereby generating a final output signal.

18. A method according to claim 17 further comprising feeding the final output signal back to the gain stages.

19. A method according to claim 15 wherein generating a plurality of output signals comprises amplifying the input signal with different gains.

20. A method according to claim 19 wherein the different gains are binarily weighted.

21. A method according to claim 15 wherein generating a plurality of output signals comprises:
attenuating the input signal, thereby generating a plurality of attenuated signals; and
amplifying the attenuated signals with the same gain.

22. A method according to claim 15 further comprising actively matching the input impedance seen by the input signal.

23. A method for amplifying an input signal comprising:
generating a plurality of output signals responsive to the input signal using a plurality of gain stages, wherein the gain stages have different noise and different input signal ranges;
loading the output signals, thereby generating an intermediate signal; and
selectively enabling and disabling the gain stages;
wherein loading the output signals comprises loading the output signals such that the gain of the intermediate signal with respect to the input signal is substantially constant regardless of which gain stage or stages are enabled.

24. An amplifier comprising:
a plurality of gain means for generating a plurality of output signals responsive to an input signal, wherein the plurality of gain means have different noise and different input signal ranges;

loading means for providing different impedances to the gain means and generating a single intermediate signal responsive to the output signals; and means for selectively enabling and disabling the plurality of gain means.

25. An amplifier comprising:

a plurality of gain means for generating a plurality of output signals responsive to an input signal, wherein the plurality of gain means have different noise and different input signal ranges;

loading means for providing different impedances to the output signals;

means for selectively enabling and disabling the plurality of gain means; and buffer means for buffering an intermediate signal generated by the loading means.

26. An amplifier according to claim 25 further comprising feedback means for feeding back a final output signal from the buffering means to the plurality of gain means.

27. An amplifier according to claim 24 wherein the gain means have different gains.

28. An to amplifier comprising:

a plurality of gain means for generating a plurality of output signals responsive to an input signal, wherein the plurality of gain means have different noise and different input signal ranges;

loading means for providing different impedances to the output signals;

means for selectively enabling and disabling the plurality of gain means; and attenuation means for generating a plurality of attenuated signals responsive to the input signal, and wherein each gain means receives one of the attenuated signals.

29. An amplifier according to claim 1 wherein the loading network comprises an impedance ladder having a plurality of taps and each of the gain stages is coupled to a different one of the taps.

30. An amplifier according to claim 13 wherein the loading network comprises a divider network, and the inputs of the buffers are coupled to opposite ends of the divider network.

31. A method according to claim 18 wherein buffering the intermediate signal comprises amplifying the intermediate signal with a selectable gain.

32. A method according to claim 18 wherein feeding the final output signal back to the gain stages comprises coupling the final output signal back to the gain stages through a variable impedance circuit.

33. An amplifier according to claim 25 wherein the buffer means has a selectable gain.

34. An amplifier according to claim 24 further comprising means for providing selectable input impedance.

35. An amplifier comprising:

a plurality of gain means for generating a plurality of output signals responsive to an input signal, wherein the plurality of gain means have different noise and different input signal ranges;

loading means for providing different impedances to the output signals;

means for selectively enabling and disabling the plurality of gain means; and means for generating a variable gain output signal responsive to the plurality of output signals.

36. An amplifier according to claim 1 wherein the interpolator is a continuous interpolator.

37. A method according to claim 15 wherein selectively enabling and disabling the gain stages comprises continuously interpolating the gain stages.

38. An amplifier according to claim 24 wherein the means for selectively enabling and disabling the plurality of gain means comprises a continuous interpolator.

* * * * *